(12) United States Patent
Liao et al.

(10) Patent No.: US 7,642,142 B2
(45) Date of Patent: Jan. 5, 2010

(54) METHOD FOR MANUFACTURING A FLASH MEMORY DEVICE WITH CAVITIES IN UPPER PORTIONS OF CONDUCTORS

(75) Inventors: Wei-Ming Liao, Taipei (TW); Ming-Cheng Chang, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 189 days.

(21) Appl. No.: 12/016,109

(22) Filed: Jan. 17, 2008

(65) Prior Publication Data
US 2009/0075467 A1    Mar. 19, 2009

(30) Foreign Application Priority Data
Sep. 17, 2007    (TW)    ................ 96134687 A

(51) Int. Cl.
*H01L 21/00*    (2006.01)
*H01L 21/84*    (2006.01)
(52) U.S. Cl. ............... 438/157; 438/142; 438/149; 438/151; 438/201; 257/E21.294
(58) Field of Classification Search ............... 438/157, 438/201, 593; 257/E21.294
See application file for complete search history.

(56) References Cited

U.S. PATENT DOCUMENTS

| 6,486,032 B1* | 11/2002 | Lin et al. | 438/266 |
| 6,596,588 B2 | 7/2003 | Chou | |
| 2005/0205922 A1* | 9/2005 | Liu et al. | 257/315 |

\* cited by examiner

*Primary Examiner*—Thanh V Pham
*Assistant Examiner*—Errol Fernandes
(74) *Attorney, Agent, or Firm*—Quintero Law Office

(57) ABSTRACT

A method for forming a semiconductor device includes providing a substrate and forming conductor patterns and openings on the substrate. Next the openings are filled with a mask layer and upper portions of the conductor patterns are etched to form cavities. Following, a portion of the mask layer is removed to form a trench between two neighboring conductor patterns, wherein the trench exposes the substrate and the sidewalls of the two neighboring conductor patterns. Next, an insulating layer on the cavities and the trench is conformably formed, a second conductive layer is formed on the insulating layer and the trench is filled with the second conductive layer.

11 Claims, 5 Drawing Sheets

METHOD FOR MANUFACTURING A FLASH MEMORY DEVICE WITH CAVITIES IN UPPER PORTIONS OF CONDUCTORS

BACKGROUND OF THE INVENTION

1. Field of the Invention

The present invention relates to a method for manufacturing a semiconductor device, and more particularly relates to a method for manufacturing a flash memory device.

2. Description of the Related Art

Since a flash memory device can be programmed and erased by electronic operations, such as applying different voltages, it has become a widely used memory module. Depending on the gate structure, flash memories can be divided into a stacked-gate flash memory or a split-gate flash memory. Although the stacked-gate flash memory occupies less area, an over-erasing problem sometimes occurs during the operation. Therefore, the split-gate flash memory is currently used to eliminate the over-erasing problem.

A flash memory device usually includes a control gate and a floating gate. The control gate serves the function of a select or access transistor, while the floating gate serves as a storage device. Generally, when the capacitive coupling ratio between the control gate and the floating gate is greater, the reading and/or writing speed of memory will be faster. Although the thin inter-gate dielectric layer may improve the capacitive coupling ratio between the control gate and the floating gate, the thin inter-gate dielectric layer may result in current leakage. Thus, the memory devices may suffer a data retention issue. In addition, the control gate needs more wordline voltages in order to increase the reading and erasing speed of the memory device.

Therefore, it is necessary to create a flash memory device having greater capacitive coupling ratio between the control gate and the floating gate for enhancing efficiencies of writing and erasing and decreasing the operating voltage, while concurrently having good retention of data.

BRIEF SUMMARY OF THE INVENTION

A detailed description is given in the following embodiments with reference to the accompanying drawings.

An embodiment of the invention provides a method for forming a semiconductor device, comprising: providing a substrate; forming conductor patterns and openings on the substrate; filling the openings with a mask layer; etching upper portions of the conductor patterns to form cavities; defining a trench in a combination of the conductor patterns and the mask layers which fills into the openings so as to exposes the substrate and sidewalls of two neighboring conductor patterns; conformably forming an insulating layer on the cavities and the trench; and forming a second conductive layer on the insulating layer and filling up the trench with the second conductive layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
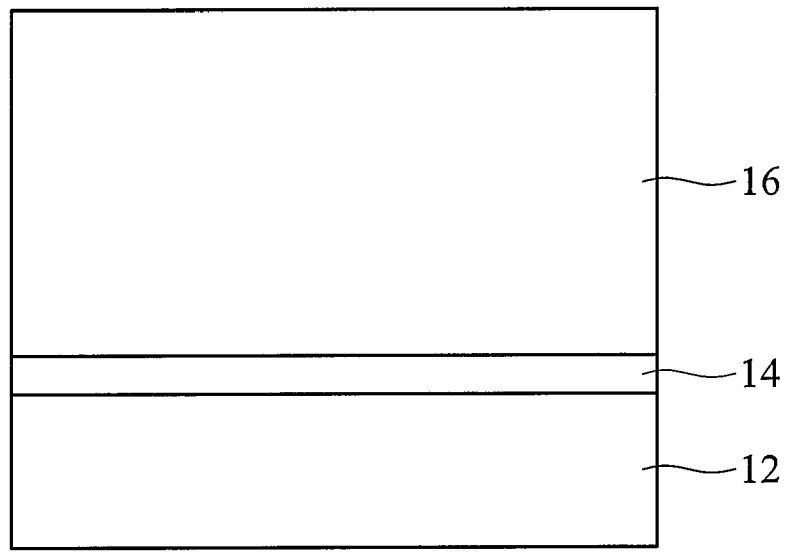
FIGS. 1 through 7 are cross-sectional views of intermediate stages in the manufacturing of a flash memory device in accordance with an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

FIGS. 1 to 7 show cross sections of a process of fabricating a flash memory device of an exemplary embodiment. Wherever possible, the same reference numbers are used in the drawings and the descriptions to refer to the same or like parts.

FIG. 1 shows the initial step of forming a flash memory device of a preferred embodiment of the invention. A substrate 12 is provided and is preferably a silicon substrate. Also, it may comprise silicon on insulator (SOI) substrate or other common semiconductor substrates can be used. In one embodiment, a plurality of shallow trench isolations (STI) (not shown) is formed in the substrate 12 to isolate subsequent flash memory devices. For example, the shallow trench isolations (STI) may be formed by etching the substrate 12 to form recesses. Next, a dielectric material such as a high-density plasma oxide (HDP oxide) is filled in the recesses and a planarization process such as chemical mechanical polish (CMP) is performed, removing the excess dielectric material to form STIs in the substrate 12. A tunneling insulating layer 14 and a first conductive layer 16 are successively formed on the substrate 12. Therein, the tunneling insulating layer 14 may be an oxide layer such as silicon dioxide ($SiO_2$) and it may be formed by common methods such as thermal oxidation, atmospheric pressure chemical vapor deposition (APCVD) or low pressure chemical vapor deposition (LPCVD). In a preferred embodiment, the tunneling insulating layer 14 is formed by thermal oxidation and forms an oxide layer which comprises $SiO_2$. The thickness of $SiO_2$ is between 70 Å and 100 Å.

Figure 2:
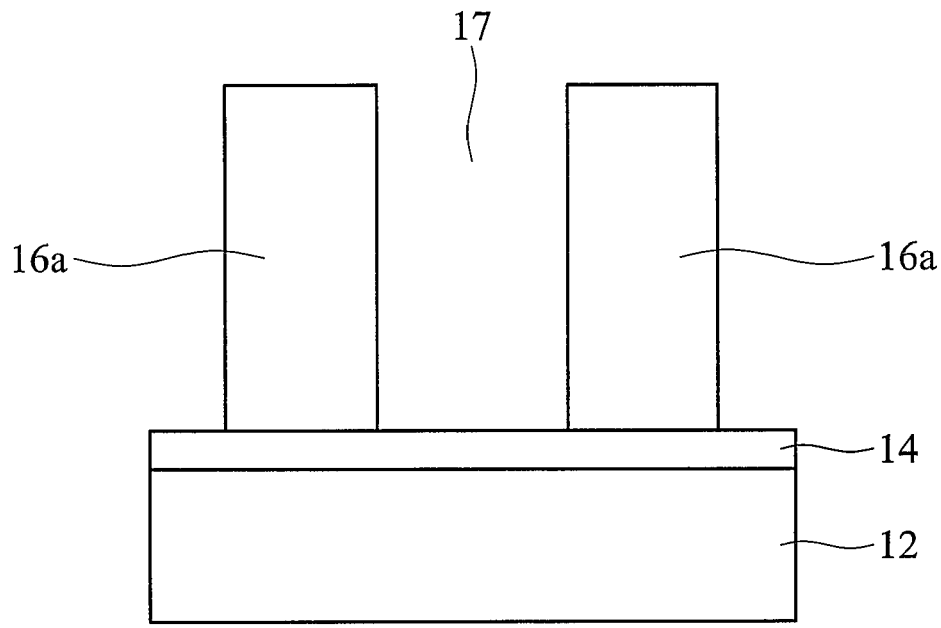

Referring to FIG. 2, openings 17 are formed in the first conductive layer 16 which exposes the tunnel insulating layer 14 in the openings 17. Then a patterned photoresist layer (not shown) may be formed on the first conductive layer 16 by photolithography and defines a position where the openings 17 are to be formed. After that, an anisotropic etching process such as dry etching is carried out for removing a portion of the first conductive layer 16 to form conductor patterns 16a and the openings 17; moreover the tunneling insulating layer 14 in the openings 17 may be exposed. In a preferred embodiment, the conductor patterns 16a serve as floating gates.

Figure 3:
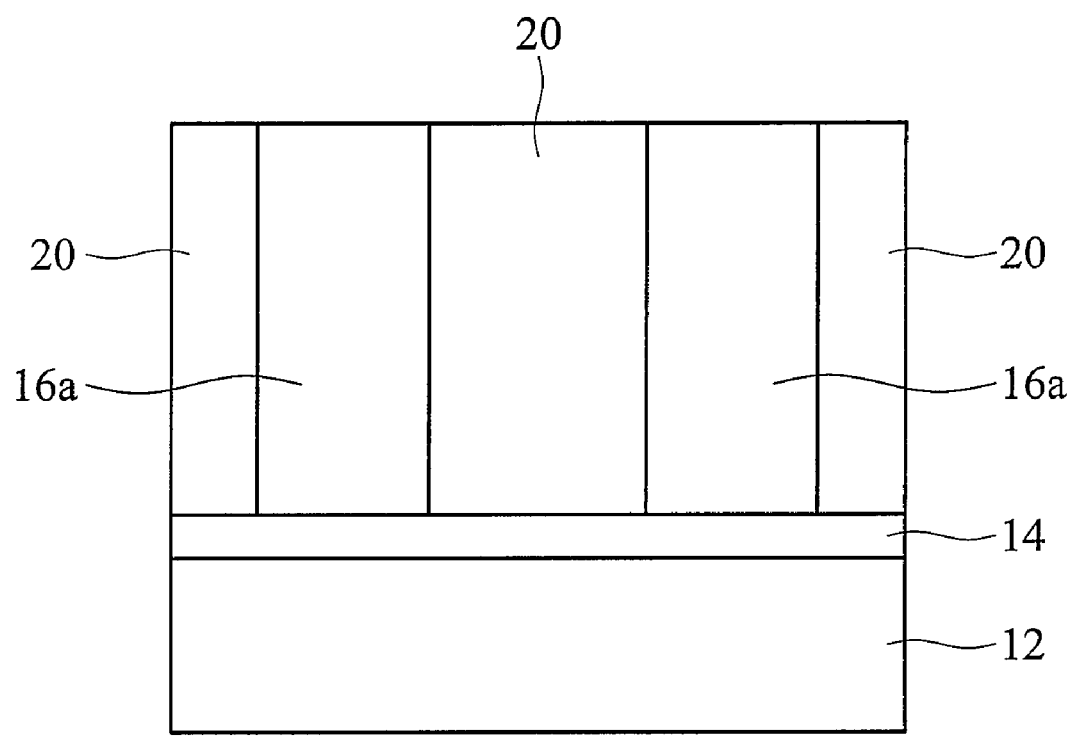

Referring to FIG. 3, a mask layer 20 is employed to fill up the openings 17 for protecting the sidewalls of the conductor patterns 16a. The planarization process such as a chemical mechanical polish (CMP) is performed and a portion of the mask layer 20 above the conductor patterns 16a is removed. Therefore, a surface of the mask layer 20 is substantially coplanar with surfaces of the conductor patterns 16a. The mask layer 20 may be an oxide layer such as BPSG or a photoresist layer formed by APCVD or LPCVD.

Figure 4A:
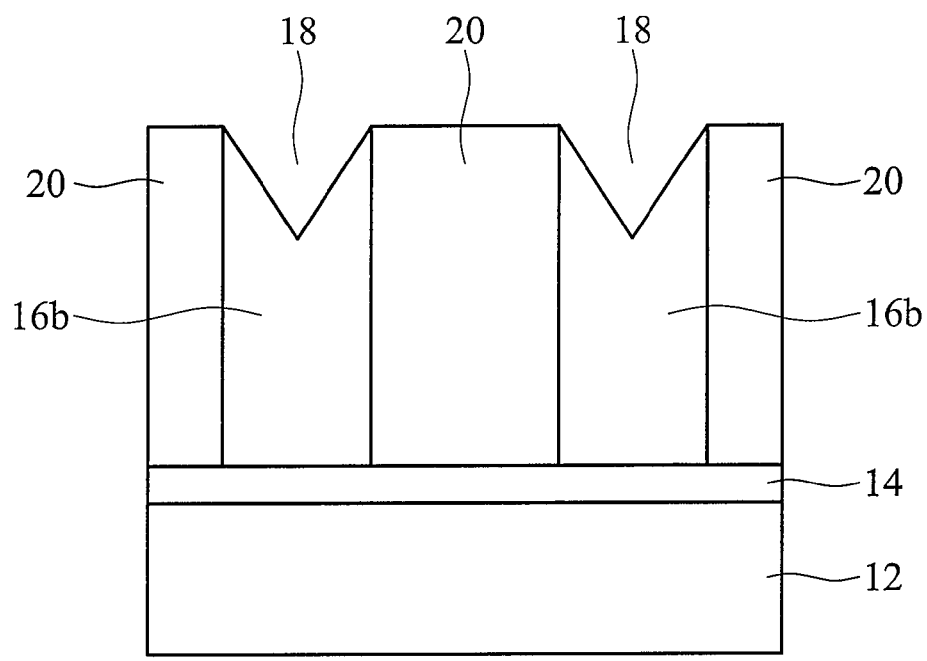

Referring to FIG. 4A, an etching process is performed to remove a portion of the conductor patterns 16a. Thus, conductor patterns 16b with cavities 18 are formed. The cavities 18 may have a substantially V-shaped or conoid-shaped configuration. In one embodiment, a wet etching process with an etchant comprising tetramethyl ammonium hydroxide (TMAH) is performed to remove the conductor patterns 16a which are not covered by the mask layer 20. Therefore, the cavities 18 are formed in the conductor patterns 16b. Preferably, the conductor patterns 16b are made of epitaxial silicon since epitaxial silicon can be etched by an etchant comprising TMAH in a direction of 56° and then an angle of the bottom of the cavities 18 is formed and is about 56°. The thickness of the conductor patterns 16a is between 1000 Å and 3000 Å. Therefore, in an embodiment of the invention, the cavities 18 may be formed by self aligned and do not need to be defined by an additional photolithography or a mask process.

Figure 4B:
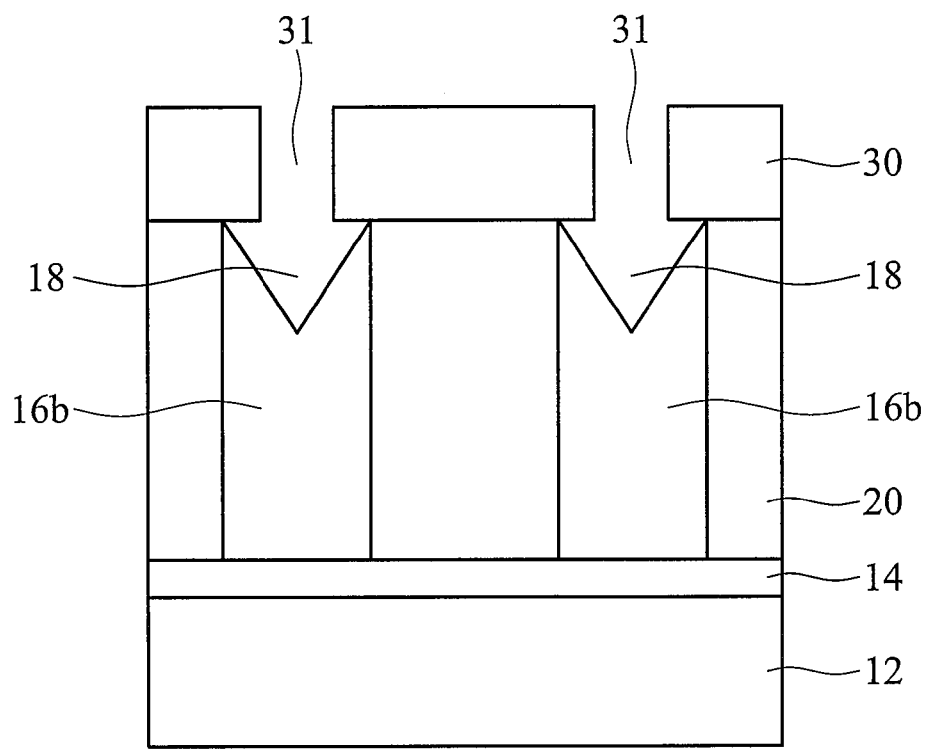

In another embodiment of the invention as FIG. 4B shows, a patterned photoresist 30 with openings 31 is formed on the conductor patterns 16a and mask layer 20 as shown in FIG. 3 by performing a photolithography process, for defining a position where the cavities 18 are to be formed. In this embodiment, the opening 31 of the patterned photoresist 30 has a dimension smaller than that of the defined position where the cavities 18 are to be formed and then a substantially V-shaped or conoid-shaped configuration in cavities 18 may be formed during a subsequent ion etching process. In one example, a portion of the conductor patterns 16a as shown in FIG. 3 can be removed by such as reactive ion etching process (RIE), electron cyclotron resonance (ECR), inductively coupled plasma (ICP) or other similar ion etching processes for forming the cavities 18 on the upper portion of the conductor patterns 16a. The conductor patterns 16a may include epitaxial silicon or polysilicon with a thickness which is between 1000 Å and 3000 Å.

Figure 5A:
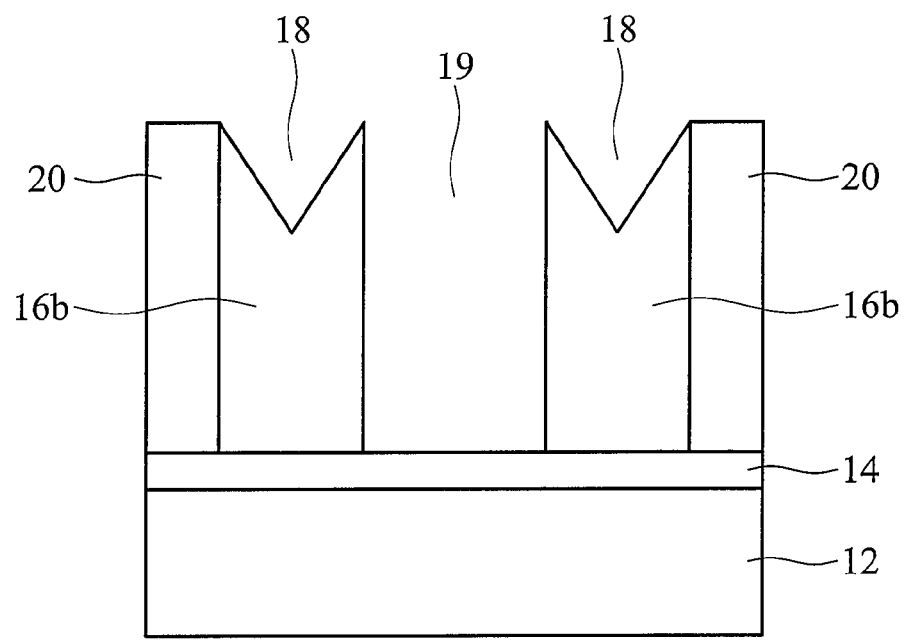
Figure 5B:
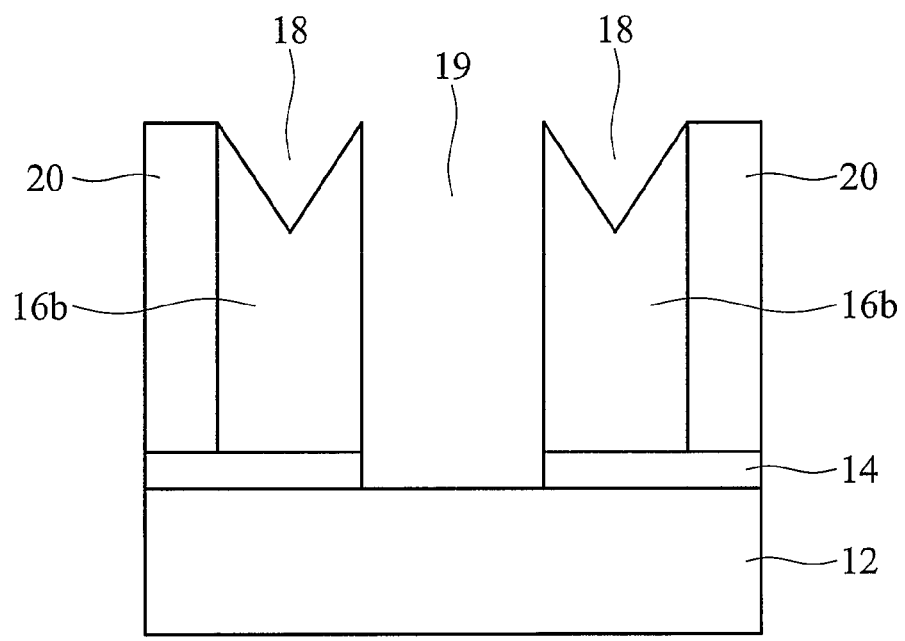

Refereeing to FIG. 5A, a portion of the mask layer 20 is removed by, such as an anisotropic etching or dry etching process for forming a trench 19 between two neighboring conductor patterns 16b, in which the trench 19 exposes a portion of the tunneling insulating layer 14 and the sidewalls of the two neighboring conductor patterns 16b. In one embodiment of the invention, a patterned photoresist layer (not shown) is formed on the conductor patterns 16b and the mask layer 20 in accordance with FIG. 5B by photolithography and the position of the trench 19 can be defined. Next, a portion of the mask layer 20 is removed by such as an anisotropic etching process or dry etching to form the trench 19 and a portion of the tunneling insulating layer 14 on the bottom portion of the trench 19 can also be removed. Consequently, the substrate 12 and the sidewalls of the conductor patterns 16b within the trench 19 are exposed.

Figure 6:
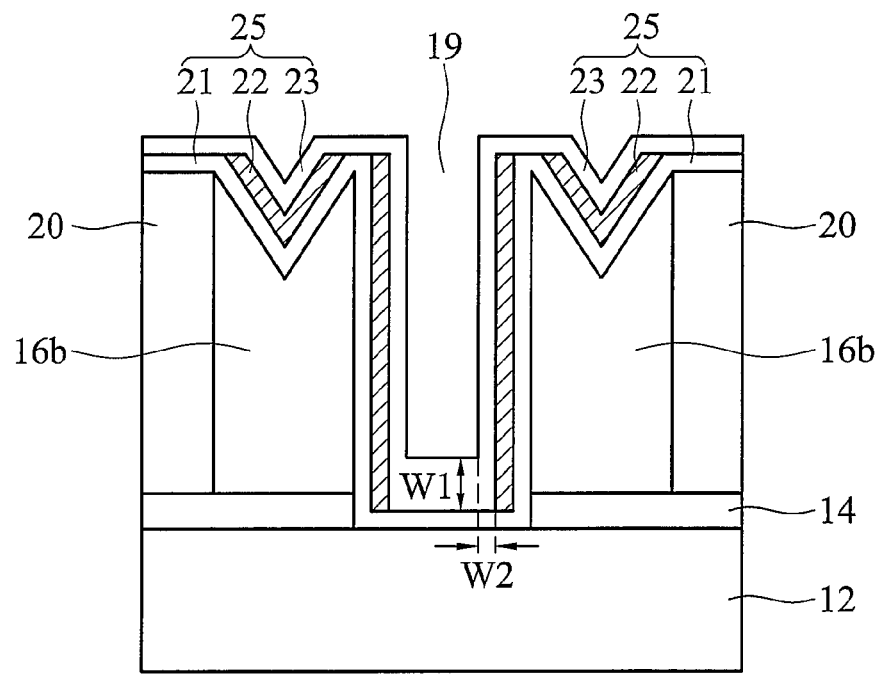

Referring to FIG. 6, an insulating layer 25 is conformably formed on both the cavities 18 and the trench 19. In a preferred embodiment of the invention, the insulating layer 25 is a composite layer. First, a first insulating layer 21 is conformably formed on upper portions of the cavities 18 and the trench 19. In one example, a thermal oxidation process is performed to form the first insulating layer 21 which includes $SiO_2$. The thickness of the first insulating layer 21 is between 30 Å and 100 Å. After that, a second insulating layer 22 is conformably formed on the first insulating layer 21. In a preferred embodiment, the second insulating layer 22 may be formed by CVD and may be a nitridation layer such as $Si_3N_4$ which has a thickness of 30 Å and 100 Å. Next, a portion of the second insulating layer 22 is removed by an anisotropic etching process such as dry etching to expose the first insulating layer 21 on a bottom portion of the trench 19 (not shown).

Subsequently, a third insulating layer 23 is conformably formed on the first insulating layer 21 and the second insulating layer 22. In an embodiment of the invention, the third insulating layer 23 is an oxide layer such as $SiO_2$ and is formed by high temperature oxidation (HTO). The thickness of the third insulating layer 23 is between 30 Å and 100 Å. It is noted that the thickness W1 of the third insulating layer 23 which parallels with the substrate 12 (an example of a bottom of the trench 19) is thicker than the thickness W2 of the insulating layer which is perpendicular to the substrate 12 (an example of the sidewalls of the conductor patterns 16b).

Figure 7:
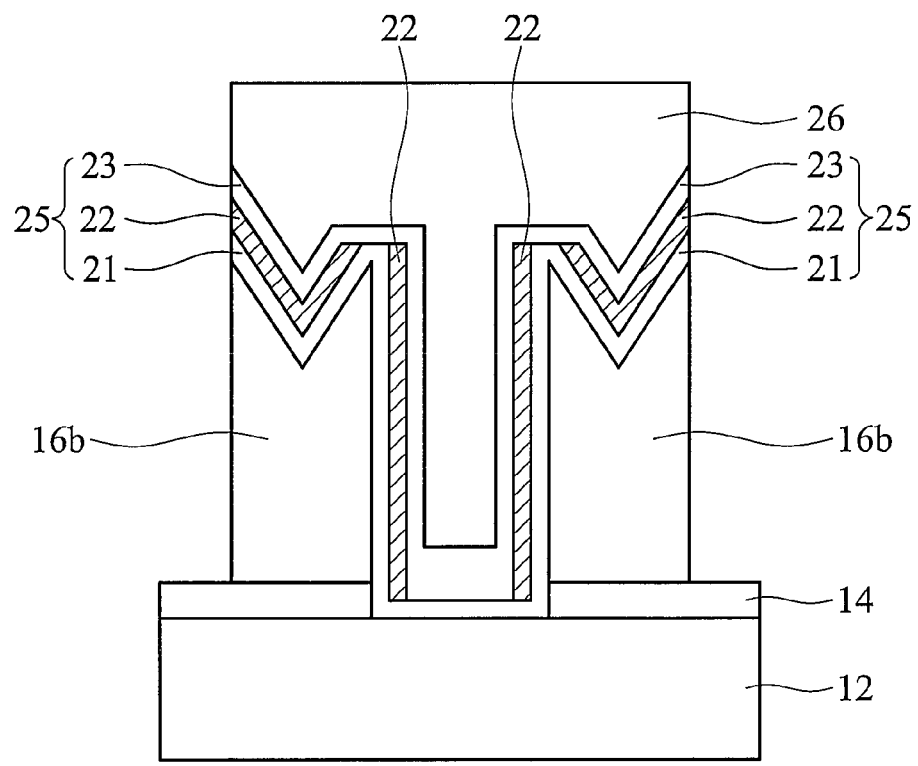

Referring to FIG. 7, a second conductive layer 26 is formed on the third insulating layer 23 and employed to fill up the trench 19 and the cavities 18 to form a T-shaped structure as a control gate. The second conductive layer 26 may be a polysilicon formed by CVD. The thickness of the second conductive layer 26 is between 1000 Å and 3000 Å. Then, a planarization process such as chemical mechanical polish (CMP) is performed for forming an even top surface of the second conductive layer 26 and for requirement of a subsequent process.

The embodiments can provide many kinds of advantages. For example, the contact areas can be increased between a floating gate and a control gate by forming a cavity opening in the floating gate. Thus, a capacitive coupling ratio may be increased. Furthermore, under an operating voltage, the tips of the cavity opening may produce a high electric field in order to promote efficiencies of programming or erasing of the device, meanwhile, the operating voltage on the control gate may also be decreased.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method for forming a semiconductor device, comprising:
    providing a substrate;
    forming conductor patterns and openings in between two neighboring conductor patterns on the substrate;
    filling the openings with a mask layer;
    etching upper portions of the conductor patterns to form cavities;
    defining a trench in a combination of the conductor patterns and the mask layers which fill into the openings so as to expose the substrate and sidewalls of two neighboring conductor patterns;
    conformably forming an insulating layer on the cavities and the trench; and
    forming a second conductive layer on the insulating layer and filling up the trench with the second conductive layer.

2. The method for forming a semiconductor device as claimed in claim 1, wherein formation of the cavities comprises removing a portion of the conductor patterns by a wet etching process.

3. The method for forming a semiconductor device as claimed in claim 2, wherein the wet etching process with an etchant comprises tetramethyl ammonium hydroxide (TMAH).

4. The method for forming a semiconductor device as claimed in claim 1, wherein formation of the cavities comprises removing a portion of the conductor patterns by an ion etching process.

5. The method for forming a semiconductor device as claimed in claim 1, wherein the conductor patterns are made of a material selected from the group consisting essentially of epitaxial silicon and polysilicon.

6. The method for forming a semiconductor device as claimed in claim 4, wherein formation of the cavities comprises forming a patterned photoresist layer with openings on the conductor patterns, and the patterned photoresist layer serves as a mask for performing an ion etching process on the conductor patterns.

7. The method for forming a semiconductor device as claimed in claim 6, wherein each opening of the patterned photoresist layer has a dimension smaller than that of each of the cavities.

8. The method for forming a semiconductor device as claimed in claim 1, wherein the insulating layer is a composite layer, and formation of the insulating layer comprises:

conformably forming a first insulating layer on upper portions of the cavities and the trench;

conformably forming a second insulating layer on the first insulating layer and removing the second insulating layer on a bottom portion of the trench to expose the first insulating layer thereon;

conformably forming a third insulating layer on the first and second insulating layer.

9. The method for forming a semiconductor device as claimed in claim 8, wherein both the first and third insulating layer are made of oxide layer.

10. The method for forming a semiconductor device as claimed in claim 8, wherein the second insulating layer is made of nitridation layer.

11. The method for forming a semiconductor device as claimed in claim 8, wherein the mask layer is made of a material selected from the group consisting essentially of oxide layer and photoresist layer.

* * * * *